US006781209B1

(12) United States Patent
Althaus et al.

(10) Patent No.: US 6,781,209 B1
(45) Date of Patent: Aug. 24, 2004

(54) OPTOELECTRONIC COMPONENT WITH THERMALLY CONDUCTIVE AUXILIARY CARRIER

(75) Inventors: Hans-Ludwig Althaus, Lappersdorf (DE); Gerhard Kuhn, Koefering (DE); Wolfgang Gramann, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/048,113

(22) PCT Filed: Jul. 13, 2000

(86) PCT No.: PCT/DE00/02295

§ 371 (c)(1),
(2), (4) Date: May 6, 2002

(87) PCT Pub. No.: WO01/09962

PCT Pub. Date: Feb. 8, 2001

(30) Foreign Application Priority Data

Jul. 28, 1999 (DE) .......................................... 199 35 496

(51) Int. Cl.[7] ...................... H01L 31/0232; H01L 31/00
(52) U.S. Cl. ............................. 257/432; 257/80; 257/81; 257/98; 257/99; 257/100; 257/103; 257/444
(58) Field of Search ............................. 257/88, 98, 99, 257/100, 103, 81, 80, 82, 84, 432, 444, 91, 92, 95, 433, 114, 460, 447; 385/92, 93, 89

(56) References Cited

U.S. PATENT DOCUMENTS 4,967,241 A * 10/1990 Kinoshita et al. ............. 257/85

| 5,481,386 A | 1/1996 | Shimano et al. |
| 5,907,151 A | 5/1999 | Gramann et al. |

FOREIGN PATENT DOCUMENTS

| DE | 195 27 026 A1 | 7/1995 |
| EP | 0 413 489 A2 | 8/1990 |
| EP | 0413489 | * 2/1991 |
| EP | 0 786 836 A2 | 1/1997 |
| JP | 58097884 | 6/1983 |
| JP | 63-244781 A | 10/1988 |
| JP | 63244781 | 10/1988 |
| JP | 4-207079 A | 7/1992 |

OTHER PUBLICATIONS

G. Benz, "Optoelektronische Mikrosysteme" vol. 1: 1993 pp. 134–142.

English Translation of PCT International Preliminary Examination Report, dated Nov. 8, 2001, 7 pgs.

* cited by examiner

Primary Examiner—Minhloan Tran
Assistant Examiner—Tan Tran
(74) Attorney, Agent, or Firm—Peter F. Corless; Steven M. Jensen; Edwards & Angell, LLP

(57) ABSTRACT

The invention relates to an optoelectronic component with a light emitting or light receiving element (1) and a system carrier (9) supporting the element (1). The element (1) emits or receives light on a light transmitting surface (1a), an auxiliary carrier (2) made of heat conductive material and transparent at least in some areas or at least translucent being provided. Said auxiliary carrier (2) is connected to the system carrier (9) and is thermally coupled to the element (1). The invention also relates to a method for the production of such an optoelectronic component.

20 Claims, 4 Drawing Sheets

OPTOELECTRONIC COMPONENT WITH THERMALLY CONDUCTIVE AUXILIARY CARRIER

BACKGROUND OF THE INVENTION

The invention relates to an optoelectronic component with a light emitting or light receiving element and a system carrier supporting said element for the support or installation of said component, an auxiliary carrier transparent to light in at least some areas or at least translucent and made of heat conducting material being provided, said auxiliary carrier being connected to the system carrier and thermally coupled to the element and having a recess through which light passes, together with a method for manufacturing such an optoelectronic component.

Light emitting or receiving optoelectronic components are becoming increasingly important with a view to providing fast and reliable data transmission media. In such components an optical coupling of the active element, usually made of semiconductor materials, to the environment or to an optical fibre is necessary. This places increased requirements on the housings which enclose the semiconductor elements, which must ensure adequate stability for use of the components under usual conditions.

Technologies used up to now for constructing surface emitting or receiving optoelectronic components such as light emitting diodes (LEDs) as incoherent light sources, or in particular surface emitting laser diodes, so-called VCSELs (Vertical Cavity Surface Emitting Lasers) as coherent light sources, have been manufactured up to now in metal housings of relatively large dimensions (in relation to the desired degree of miniaturisation) (TO housings) with transparent windows, and usually with very complex and therefore expensive manufacturing techniques. Also known are less expensive structures with completely moulded transparent housings of plastics material (for example, the customary LED housing) or pre-moulded plastic housings with moulded-in transparent plastic portions. The disadvantage of these constructions, in particular of the cheap construction of the LED plastic moulding-in technique which finds billions of applications, lies in the fact, in particular in the case of VCSEL diodes, that when manufactured with transparent plastics materials these components cannot be produced with sufficient optical quality and/or mechanical precision for coupling to an optical fibre. For this reason only the expensive TO housings with inset optical window cap have been used up to now.

A further difficulty with regard to the required miniaturisation results from the necessity when operating some optoelectronic components to incorporate a sensor or detector monitoring the operation or adjustment of the component in the housing of the optoelectronic component. According to the prior art, as shown in EP 0 786 836 A2, this is effected by the complex installation e.g. of monitor diodes in the TO housing used. This construction is very complex with regard both to the housing materials used and to the manufacturing steps, and thus is cost-intensive. However, for manufacturing reasons, the less expensive construction by the plastic moulding-in technique permits only limited incorporation of additional monitoring functions by additional elements. A further major disadvantage of the plastic moulding-in technique is that, when used with fibre optics, the stability of the structures and materials used for the plastic housing body is insufficient for precise coupling of the connected fibres. Plastic housing bodies can therefore be used for secure coupling only up to a maximum glass fibre diameter of 50 μm, and in particular cannot be used for single-mode fibres.

A further problem with optically emitting components is power loss in light generation. The heat arising in such components reduces the optical conductivity, sometimes substantially, by heating up the active light emitting zones.

Known from DE 195 27 026 A1 is an optoelectronic component which has a radiation emitting and/or receiving semiconductor element as the light emitting or receiving element. The semiconductor element is fixed to a carrier plate which rests on a base plate with an opening. The radiation emitted from the semiconductor element can pass out through the carrier platet and the opening in the base plate. To focus the radiation emitted by the semiconductor element the carrier plate has a lens configuration in the area of the opening in the base plate.

Known from Patent Abstracts of Japan, E-1290, 1992, Vol. 16/No. 542, JP 4-207079 A is a layer construction on a substrate in which a photodiode is formed to detect the light emitted to the layer construction.

Further known from U.S. Pat. No. 4,967,241 is a layer construction on a substrate in which a funnel-shaped passage is formed for the light emitted by the layer construction. A photodiode is formed in the substrate to detect the light emitted from the layer construction.

Finally, Patent Abstracts of Japan, E-712, 1989, Vol. 13/No. 51, JP 63-244781 A discloses a tubular housing with a funnel-shaped opening behind which a light emitting element is mounted. The light emitted by the light emitting element is focused by a spherical lens arranged in the funnel-shaped opening.

BRIEF SUMMARY OF THE INVENTION

It is the object of the invention to make available an optoelectronic component which can be manufactured at low cost and with the necessary optical qualities, and which reduces the heat generated in the element through energy dissipation and ensures good optical imaging or coupling out of the light.

This object is achieved with regard to the device and with regard to the method according to the claimed invention.

According to the invention an auxiliary carrier which is transparent at least in some areas or is at least translucent and is made of heat conductive material is provided, and firstly is connected to the system carrier and secondly is thermally coupled to the element. The feature "transparent in some areas or at least translucent" means that either the material of the auxiliary carrier itself is transparent or an opening or at least a recess allowing the passage of light is provided.

The invention further proposes to provide an auxiliary carrier for the light emitting or receiving element, which carrier ensures optimal thermal conduction in particular to the system carrier—while being of very small dimensions—and at the same time does not obstruct the inward or outward passage of light or ensures a targeted emission of light. A further advantage resulting from this feature is that the mounting of the element connected to the auxiliary carrier on the system carrier is substantially simplified since the dimensions of the system carrier are larger than those of the element alone and the auxiliary carrier is less sensitive when manipulated.

Following the principle of the invention a recess through which light passes is provided in the auxiliary carrier. Through said recess light rays for which the material of the auxiliary carrier is insufficiently transparent or is completely non-translucent can also penetrate the auxiliary carrier. To this end the recess is covered by a thin, light-permeable covering layer formed from said auxiliary carrier. The thickness of the light-absorbent material through which the light must pass is thereby reduced to a minimum. It is possible to form a sensor through which light is to pass in the relatively thin covering layer.

According to a preferred embodiment of the invention the auxiliary carrier is mechanically connected to the element in a planar fashion. Good heat dissipation from the element into the auxiliary carrier and a secure connection are thereby ensured. The auxiliary carrier is advantageously connected electrically to the element by means of an electrical bonding, facilitating current supply and signal conductance.

According to a further advantageous and therefore preferred embodiment of the invention a light-sensitive sensor is formed on or in the auxiliary carrier. Likewise, according to another advantageous embodiment of the invention a light-sensitive sensor is formed on or in the element. The advantage of this arrangement is that a sensor no longer needs to be installed in the housing incorporating the element by means of complex assembly steps. The direct integration in the auxiliary carrier makes it possible during irradiation of same to detect, for example, the quality or quantity of the emitted or received light independently of the element. Through such forming of a sensor in the auxiliary carrier or in the element itself complex and costly manufacturing steps can be saved and the efficiency of production can be improved.

According to a further aspect of the invention the system carrier is provided with an opening which allows light to pass through said system carrier. According to these embodiments the recess in the auxiliary carrier and/or the opening in the system carrier advantageously has the form of a truncated cone or truncated pyramid or is cylindrical with smooth side faces. By this means a divergent beam can emerge unobstructed and an incident beam can be concentrated by suitable measures into the area through which light passes.

According to a further preferred embodiment of the invention a focusing arrangement and/or an arrangement which changes the beam path of the light is advantageously arranged in the optical axis of the component. The quality and form of the beam and the coupling in and out of the light can thereby be advantageously influenced. Accordingly, in one embodiment of the invention the optical arrangement is advantageously fitted inside the opening of the system carrier and/or the recess of the auxiliary carrier.

According to a further advantageous aspect of the invention the optical arrangement is formed as a lens or a transparent platelet which is arranged between the surface normal of said platelet and the optical axis of the component at a defined angle which, according to another advantageous embodiment of the invention, is so selected that the smallest possible proportion of the emitted light is reflected by the surface of the platelet, and/or that a predetermined proportion is reflected in a defined direction. Through the reflection of a proportion of the emitted light, said proportion can be coupled into the sensor for evaluation.

An adhesive or bonding agent by means of which the optical arrangement is fixed inside the opening of the system carrier is preferably provided. A secure fixing of the optical arrangement is thereby achieved.

Advantageously, predetermined support points or support edges are provided on the side faces and/or edges of the recess of the auxiliary carrier and/or the side faces and/or edges of the opening in the system carrier for the self-adjusting alignment of the optical arrangement with respect to the optical axis of the component. A complex and error-prone positioning of the optical arrangement with respect to the element is thereby eliminated. Rapid and low-cost positioning of the optical arrangement is therefore possible. Consequently the support points or support edges are advantageously arranged on the outermost edges of the recess facing away from the element and/or on the outermost edges of the opening facing away from the element and/or on a middle section of the wall of the opening or recess.

According to a further preferred aspect of the invention the sensor is formed by an active electronic component, in particular a semiconductor component structured in or on the auxiliary carrier or its covering layer or in or on the element, the auxiliary carrier consisting preferably of a silicon substrate or a silicon-carbon compound and, according to another further development, the sensor is electrically coupled to the element indirectly via another circuit or directly. This makes possible a particularly reliable and inexpensive integration of the sensor, which is advantageously formed by a diode or a transistor, into the auxiliary carrier or into the element.

According to an especially preferred embodiment of the invention the element is formed by a VCSEL chip (coherently radiating diodes), an IRED chip (IRED= InfraRed Emitting Diode), spontaneously emitting diodes, or another chip emitting light on one surface. The resulting heat generated by energy dissipation is quickly dissipated through the good thermal conductivity of the auxiliary carrier to the system carrier connected thereto, so that reliable operation unrestricted by heat build-up is possible. The light emitting lateral face faces towards the auxiliary carrier which is irradiated by the light.

According to a further embodiment of the invention the system carrier is at least partially encapsulated with the auxiliary carrier fixed to it, by a non-transparent pressing, casting or moulding mass. Safe handling and reliable operation of the optoelectronic component are thereby ensured and miniaturisation of the housing, for example to SMD dimensions, is made possible.

The method for producing an optoelectronic component according to the invention, said component consisting of an element emitting or receiving light on a light transmitting surface and a system carrier supporting said element, provides for the connection of an auxiliary carrier transparent in at least some areas or at least translucent and made of thermoconductive material to the element, a thermal coupling between the auxiliary carrier and the element being produced. According to this method a mechanical connection of the auxiliary carrier supporting the element to the system carrier is provided.

A recess for the unimpeded passage of light through the auxiliary carrier is formed according to a process step according to the invention by anisotropic etching before connection of the auxiliary carrier to the element. Then, in a further process step while etching the recess, a covering layer with a thickness of $<=50$ $\mu$m and covering the recess is left in place. The formation of a light-permeable sensor even when an absorbent material is used for the auxiliary carrier is thereby made possible.

According to a further especially preferred process step the formation of a sensor independent of the element is provided on or in the auxiliary carrier and/or the element by means of structuring steps used in semiconductor technology, before connection of these parts.

According to a further advantageous process step a multiplicity of auxiliary carriers, to be separated in a further process step, is combined jointly in a composite structure with independent sensors and/or the elements to be connected to same.

Also preferred is the fixing of an optical arrangement in the opening of the system carrier, the optical arrangement being advantageously bonded into the opening by means of an adhesive or bonding agent.

The system carrier is advantageously encapsulated at least partially with the auxiliary carrier attached to it and the element located on it, by means of a non-transparent pressing, casting or moulding mass.

Further advantages, peculiarities and advantageous further developments of the invention emerge from the subsidiary claims.

BRIEF DESCRIPTION OF THE DRAWINGS

The invention is further explained below with reference to the drawings. In the schematic representations.

DETAILED DESCRIPTION OF THE INVENTION

Figure 1:
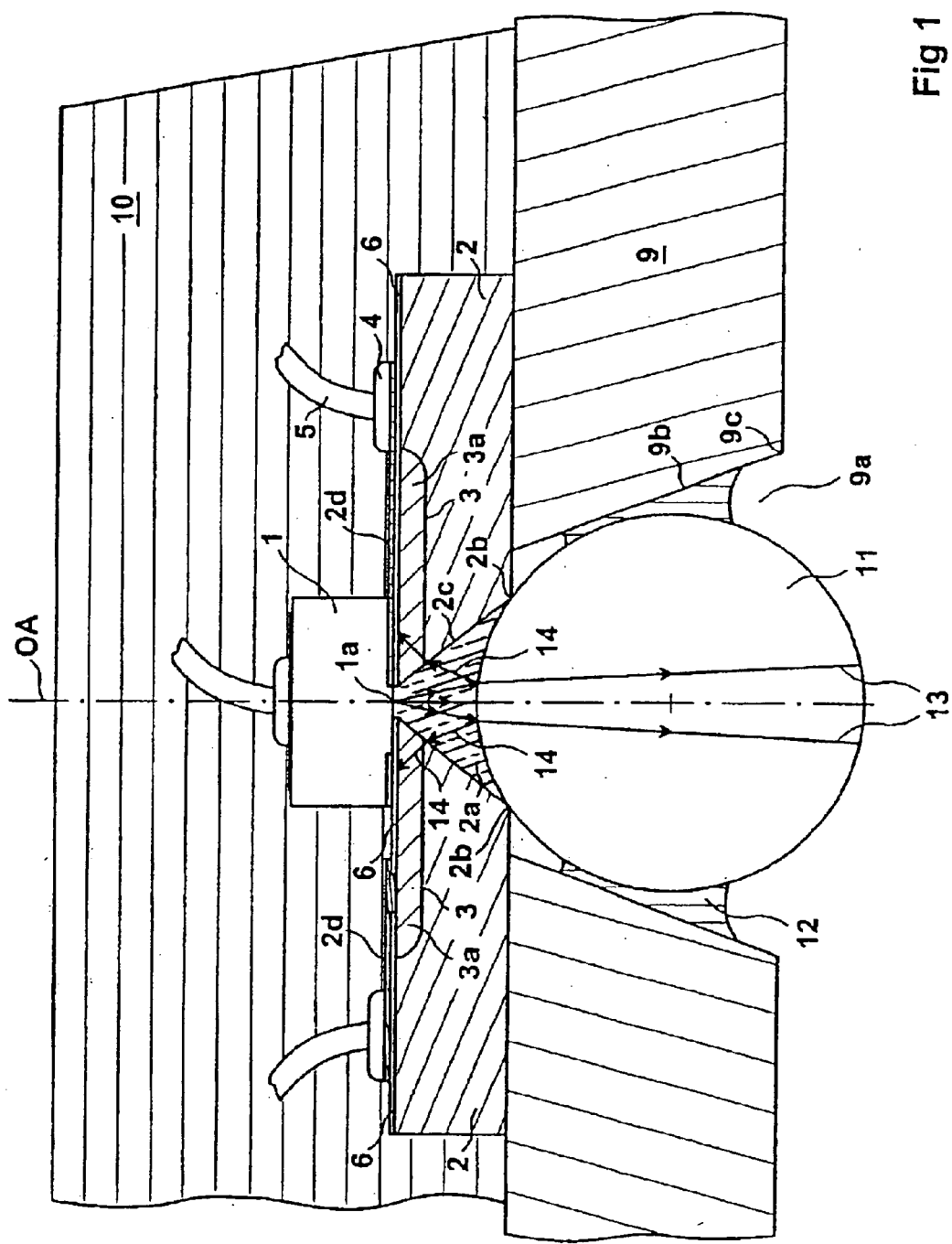
FIG. 1 is a schematic cross-sectional representation of an optoelectronic component with a lens for clarification of the invention.

In FIG. 1 a section through an optoelectronic component is shown. An emitting element 1 which is thermally coupled and mechanically connected to an auxiliary carrier 2 is supported by a system carrier 9, the auxiliary carrier 2 being connected to the system carrier 9.

The element 1 is formed by a chip e.g. a spontaneously emitting diode or a VCSEL chip emitting light 13 on the light-transmitting surface 1a. The current is supplied via bonding wires 5 connected with solder (bondpad) 4 to conductive layers (metal coatings) 2d, which in turn conduct the current to the element 1. The conductive layers 2d are partially isolated from the element 1 and the auxiliary carrier 9 by insulating layers 6. Element 1 emits at the light transmitting surface 1a towards the auxiliary carrier 2 in order to dissipate as much as possible of the heat arising in that area to the active zone of element 1 through the thermal coupling to the auxiliary carrier 2.

For wavelengths of the out-coupled or in-coupled light 13 greater than 1200 nm the auxiliary carrier 2 can be made of silicon as this material is transparent to such light waves and has excellent heat conducting properties. In this case the light 13 is emitted by the light-transmitting surface 1a through the material of the auxiliary carrier 2. In an application illustrated in FIG. 1 for light waves with a wavelength less than 1200 nm silicon is no longer sufficiently transparent and is therefore unsuitable. For an application in which no energy dissipation occurs, with the associated heat loss, glass is conceivable as the material for the auxiliary carrier 2. But as soon as heat must be dissipated, glass with its poor thermoconductive properties is no longer usable. For applications in which energy dissipation occurs, such as laser diodes (VCSEL diodes), therefore, materials with good thermal conductivity are used for the auxiliary carrier 2 in order to prevent heat build-up with the concomitant limitation of the functionality or the optical efficiency of the component.

In order nevertheless to utilise the good heat conducting properties of silicon without impeding the passage of the emitted light 13, a recess 2a is provided in the auxiliary carrier 2 made of silicon, said recess 2a being so arranged that the light-emitting area of light-transmitting surface 1a is arranged above the small recess 2a in the auxiliary carrier 2. The recess 2a can be produced by etching. In order to obtain good results with respect to the geometry of the recess 2a (a truncated cone or a truncated pyramid is the most suitable form) and with respect to the properties of the lateral faces 2c of the recess 2a, the anisotropic micro-mechanical etching technique is used. This technique makes it possible to produce the smallest possible truncated conical or pyramidal recess 2a (while still leaving sufficient material for heat dissipation) in the range of some tens of $\mu$m with a completely smooth and level assembly face (to which the element 1 or the system carrier 9 is attached).

The covering according to the invention for the recess 2a, which covering is formed by the auxiliary carrier 2 itself, is illustrated schematically in FIG. 1.

So that the emitted light 13 can further be radiated unimpeded from the component, an opening 9a, which likewise can have the form of a truncated cone or pyramid or of a cylinder and has smooth lateral faces, is provided in the system carrier 9 connected to the auxiliary carrier 2. The opening 9a of the system carrier 9 is so configured that it can accommodate an optical arrangement for changing the beam form or the beam path, for example in the form of a focusing lens 11. An optimum coupling out of the light 13 can therefore be made possible. To fix the lens 11 securely and to isolate the emitting element 1 from the environment an adhesive agent 12 is provided to retain the lens 11 in the opening. Because a precise disposition of the optical arrangement with respect to the optical axis OA of the optoelectronic component is important for the operation of same, support points or support edges are provided on the outermost edges 2b of the recess 2a, facing away from the element 1, for the self-adjusting alignment of the lens 11, by which support points or edges the lens 11 aligns itself when being installed.

The lens 11 can therefore precisely image and couple in the emitted light beam, for example into an optical fibre, not illustrated. Instead of the outermost edges 2b of the recess 2a, the outermost edges 9c of the opening 9a facing away from the element 1, or a defined point in the central portion of the wall of the opening 9b or of the recess 2c, are also suitable as support edges.

To be able to monitor the operation of the emitting element 1 a sensor 3 is formed in the auxiliary carrier 2. This sensor is designed to be sensitive to the emitted light and is formed as a diode or a transistor with a doping range 3a. The sensor 3 is likewise connected by conductive layers 2d or bonding wires 5, or its signal is collected via same. It is also possible to design an electronic circuit to evaluate or process the signal of the sensor 3 in the auxiliary carrier.

In order to reflect a quantity 14 of the emitted light 13 sufficient for evaluation into the pn junction of the sensor 3 acting as a photodiode accessible on the lateral face 2c of the recess 2a, the lens is suitably coated. It is also possible to provide the sensor within the thin ($\leq 50$ μm) layer covering the recess 2a (said layer being left in place when etching the recess). The light beam passes directly through the covering layer. Because the layer is sufficiently thin only a small quantity ($\leq 10\%$) of light is absorbed and used for evaluation (monitoring function).

The structure of element 1, auxiliary carrier 2 and system carrier 9 is enclosed for protection by a non-transparent moulding mass so formed that light is still able to pass out through the system carrier. The element 1 and the sensor 3 are thereby protected against unwanted secondary light or reflections and are easy to manipulate.

The construction according to the invention makes possible an electro-optically active, surface emitting component using leadframe moulding technology which contains a monitoring function in addition to its pure emission function. In particular optoelectronic SMD components, for example for producing fibre-optic components, are thereby made possible.

Figure 2:
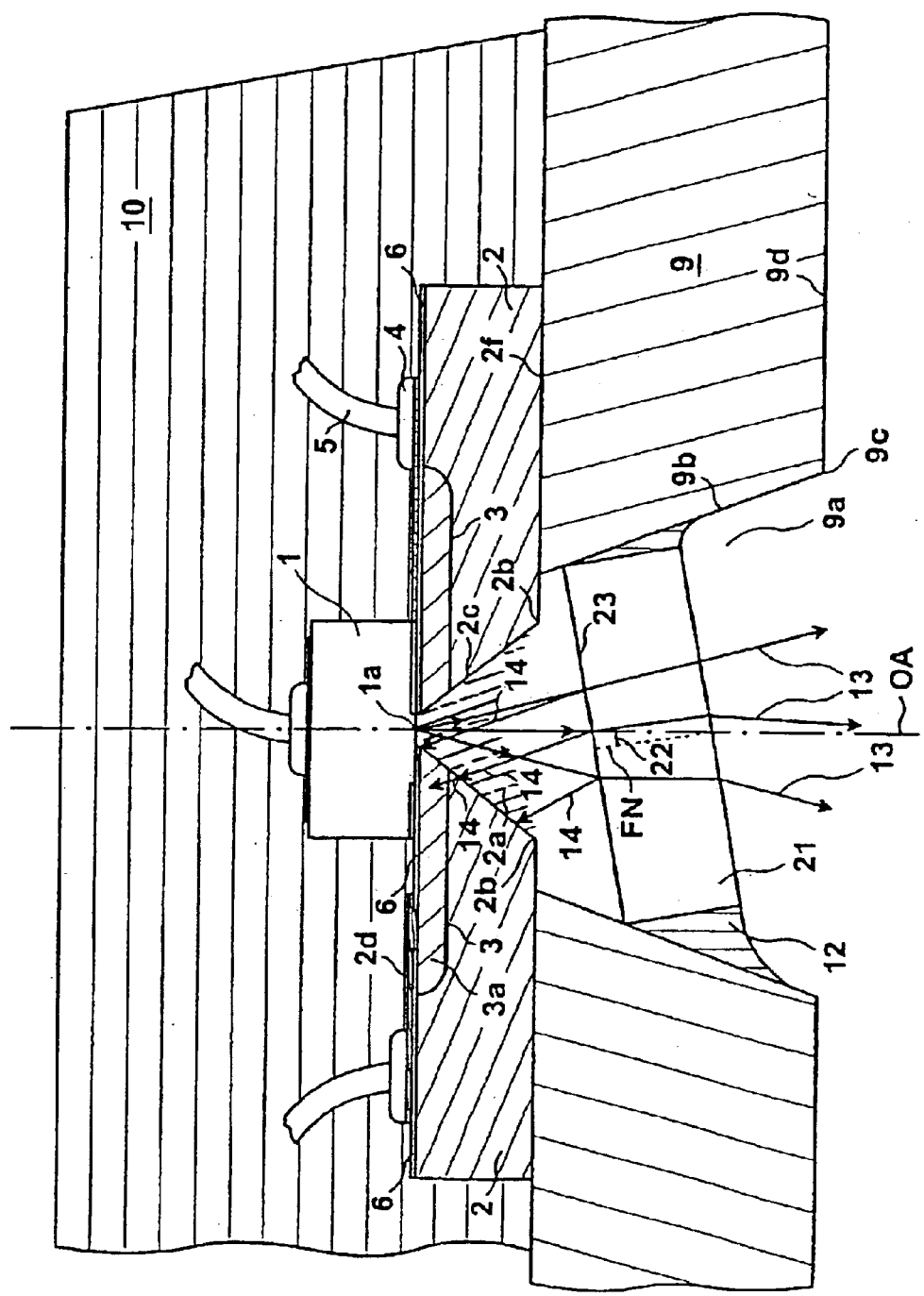
FIG. 2 is a schematic cross-sectional representation of a further optoelectronic component with an obliquely arranged outlet or inlet window for clarification of the invention.

FIG. 2 shows a section through a variant of the optoelectronic component in which, in place of a lens, a platelet 21 transparent to the emitted light 13 is fixed into the opening 9a of the system carrier 9 with an adhesive agent 12 (in the drawings the same reference numerals denote the same or analogous constituents of the device according to the invention). The platelet can be fixed either in the opening 9a, as shown, or on the outside 9d of the system carrier 9 or on the lateral face 2f of the auxiliary carrier 2 facing away from the element 1.

The platelet 21 can be arranged (as shown in the example) at a defined angle 22 between its surface normal FN and the optical axis OA of the component. Optimum transmission properties of the platelet 21 and the directions and proportions 14 of the emitted light 13 reflected back for evaluation by the sensor 3 can thereby be set. The defined angle 22 can be so selected that a highest possible proportion of light is reflected by the surface 23 of platelet 21, which is suitably metallised or coated, on to the sensor area (monitor), or a highest possible proportion passes through the platelet. It is also possible to provide a thin ($\leq 50$ μm) covering layer covering the sensor in the recess 2a. Here, too, the light passes directly through the covering layer. Because the layer is selected sufficiently thin, even in the case of absorbent material only a small quantity (<=10%) of light is absorbed and used for evaluation (monitoring function).

Figure 3:
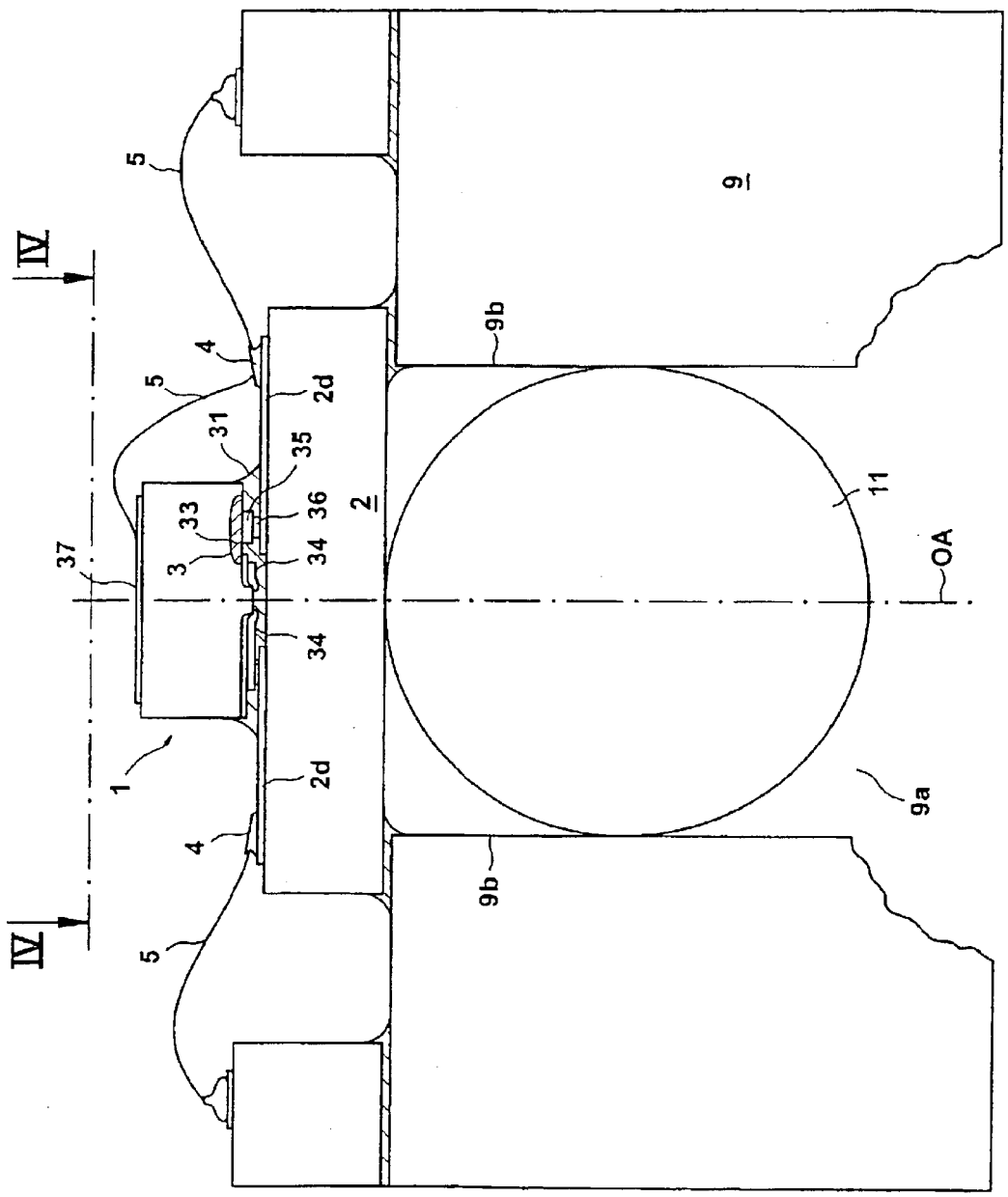
FIG. 3 is a schematic cross-sectional representation of a further preferred embodiment of an optoelectronic component according to the invention with a coherently radiating laser diode and a lens.

A section through a further variant of an optoelectronic component with a VCSEL chip as the light emitting element 1 is illustrated in FIG. 3. Here SiC, which is optically transparent and has good thermal conductivity, is used as the material of the auxiliary carrier 2 in place of silicon. However, in this case the formation of a sensor in the auxiliary carrier by means of structuring steps used in semiconductor technology is only possible with very great complexity.

In the example, the sensor 3 for the desired monitoring function is itself formed in element 1 by a suitably doped area 33. Again, current is supplied and the signal is collected via bonding wires 5 bonded to bondpads 4 and is further fed to the VCSEL chip and to the sensor 3 via conductive layers 2d and a bonding face 37, the conductive layers being electrically connected to the current supply 34 and the bonding faces 35 via a bonding agent 36 (for example, solder).

In the opening 9a of the system carrier 9, produced by drilling in this example, a lens 11 is retained in said opening with an exact fit by lateral faces 9b. To improve the coupling of the laser light into or out of the auxiliary carrier 2 a material 31 can be used to reduce undesired effects (reflection or other effects influencing the beam).

Figure 4:
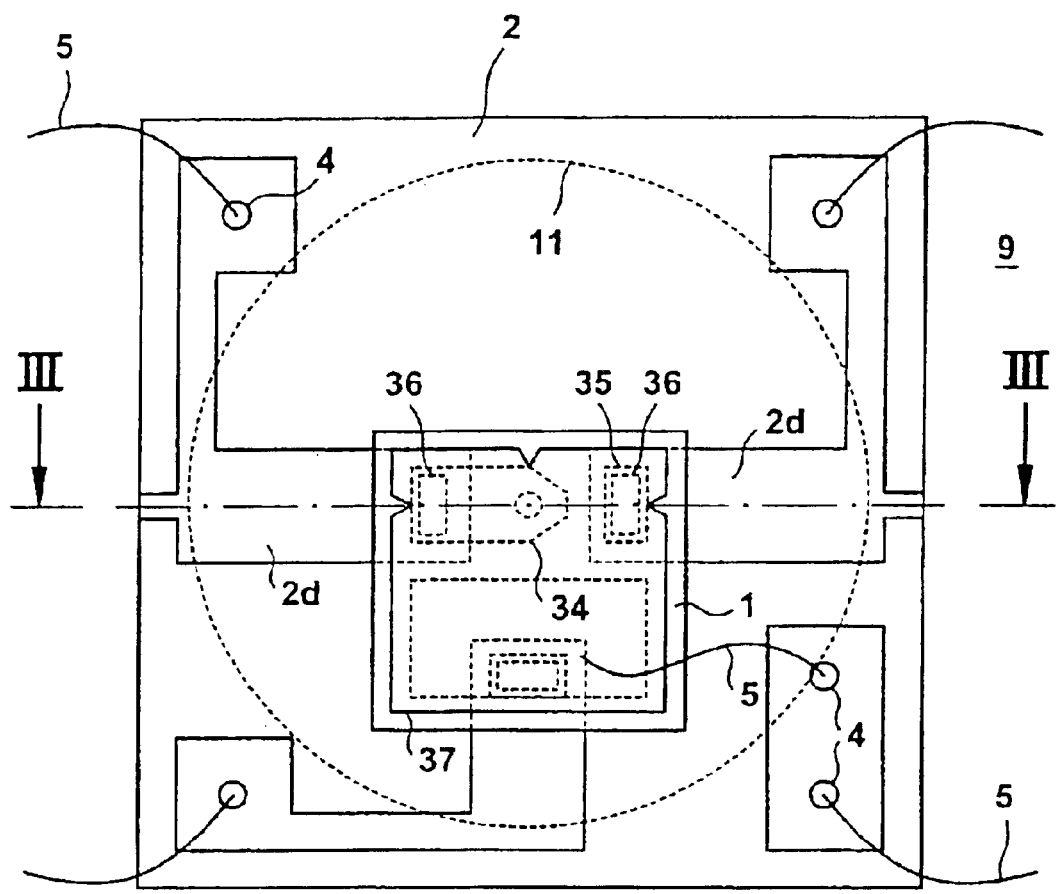
FIG. 4 is a schematic representation of the arrangement of the laser diode and the auxiliary carrier from FIG. 3 in a top view.

FIG. 4 shows a top view of the element 1 formed as a VCSEL chip and of the auxiliary carrier 2 from FIG. 3 in the direction designated by reference character IV. The reference numerals correspond to those from FIG. 3.

Generally described in this document are optoelectronic components with a light emitting or light receiving element 1 and a system carrier 9 supporting the element 1 for the support or assembly of the component, an auxiliary carrier 2 which is transparent to light at least in some areas or is at least translucent and is made of heat conducting material being provided, said auxiliary carrier 2 being connected to the system carrier 9 and thermally coupled to the element 1.

What is claimed is:

1. Optoelectronic component comprising a light-emitting element and a system carrier which supports the element, for supporting or mounting the component, an auxiliary carrier made of a thermally conductive material being provided, at least regions of which are transparent or at least translucent for light, which is connected to the system carrier, on the one hand, and is thermally coupled to the element, on the other hand, and in which a recess is provided, through which the light passes,
wherein an optical arrangement which modifies the beam path of the light, is provided in the optical axis of the component, and
wherein a light sensitive sensor is arranged in a region in which the optical arrangement reflects some of a light beam emitted by the element.

2. Optoelectronic component according to claim 1, wherein the auxiliary carrier has an electrical bonding, by means of which it is electrically connected to the element.

3. Optoelectronic component according to claim 1, wherein the auxiliary carrier is arranged between the system carrier and the element, and the auxiliary carrier and the element are mechanically connected in a substantially planar fashion.

4. Optoelectronic component according to claim 1, wherein the system carrier, composed of a non-transparent material, is provided with an opening through which light passes.

5. Optoelectronic component according to claim 1, wherein the recess in the auxiliary carrier and/or the opening of the system carrier has the configuration of a truncated cone or truncated pyramid or of a cylinder, the walls of said recess and/or opening having smooth lateral faces.

6. Optoelectronic component according to claim 1, wherein the optical arrangement is fitted inside the opening of the system carrier and/or the recess of the auxiliary carrier.

7. Optoelectronic component according to claim 1, wherein the optical arrangement is formed as a lens or a transparent platelet, the platelet being arranged at a defined angle between its surface normal and the optical axis of the component.

8. Optoelectronic component according to claim 7, wherein the angle of the platelet arrangement is selected in such a way that a smallest possible proportion of light is reflected by the surface of the platelet, and/or a predetermined proportion thereof is reflected in a defined direction.

9. Optoelectronic component according to claim 1, wherein a bonding or adhesive agent is provided, by means of which the optical arrangement is fixed inside the opening of the system carrier and/or the recess of the auxiliary carrier.

10. Optoelectronic component according to claim 1, wherein in relation to the optical axis of the component, predetermined support points or support edges for the self-adjusting alignment of the optical arrangement are provided on the lateral faces and/or edges of the recess of the auxiliary carrier and/or the lateral faces and/or edges of the opening of the system carrier.

11. Optoelectronic component according to claim 10, wherein the support points or support edges are arranged on the outermost edges, facing away from the element, of the recess and/or on the outermost edges, facing away from the element, of the opening and/or on a middle section of the opening wall or recess wall (lateral faces of the opening or recess).

12. Optoelectronic component according to claim 1, wherein the sensor is formed by an active electronic component, in particular semiconductor component, structured in/on the auxiliary carrier or the element.

13. Optoelectronic component according to claim 12, wherein the semiconductor component is formed by a diode or a transistor.

14. Optoelectronic component according to claim 1, wherein the sensor is electrically coupled to the element, either indirectly via another circuit or directly.

15. Optoelectronic component according to claim 1, wherein the auxiliary carrier has a substrate made of silicon or of an SiC compound, or is formed by such a material.

16. Optoelectronic component according to claim 1, wherein the element is formed by a VCSEL chip having a coherently radiating diode, an IRED chip, a chip having a spontaneously emitting diode or such a chip emitting light on a surface.

17. Optoelectronic component according to claim 1, wherein the system carrier, with the auxiliary carrier attached thereto, is potted or molded at least in some areas with a non-transparent pressing, casting or molding mass.

18. Optoelectronic component according to claim 1, wherein the recess in the auxiliary carrier is covered with a thin covering layer.

19. Optoelectronic component according to claim 1, wherein the light sensitive sensor is formed in the auxiliary carrier.

20. Optoelectronic component according to claim 1, wherein the light sensitive sensor is formed in the light-emitting element.

* * * * *